United States Patent
Kikuchi et al.

(10) Patent No.: US 10,629,764 B2
(45) Date of Patent: Apr. 21, 2020

(54) LIGHT ENERGY CONVERSION ELEMENT AND DEVICE COMPRISING THE SAME

(71) Applicant: Panasonic Intellectual Property Management Co., Ltd., Osaka (JP)

(72) Inventors: Ryosuke Kikuchi, Osaka (JP); Toru Nakamura, Osaka (JP); Takahiro Kurabuchi, Osaka (JP); Kazuhito Hato, Osaka (JP); Fumiyasu Oba, Kanagawa (JP); Yu Kumagai, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/516,233

(22) Filed: Jul. 18, 2019

(65) Prior Publication Data

US 2019/0386165 A1 Dec. 19, 2019

Related U.S. Application Data

(63) Continuation of application No. PCT/JP2018/048559, filed on Dec. 28, 2018.

(30) Foreign Application Priority Data

Jun. 13, 2018 (JP) .................................. 2018-112776

(51) Int. Cl.
*H01L 31/0725* (2012.01)
*H01L 31/0224* (2006.01)
*H01L 31/036* (2006.01)

(52) U.S. Cl.
CPC .. *H01L 31/0725* (2013.01); *H01L 31/022466* (2013.01); *H01L 31/036* (2013.01)

(58) Field of Classification Search
None
See application file for complete search history.

(56) References Cited

PUBLICATIONS

International Search Report of PCT application No. PCT/JP2018/048559 dated Mar. 5, 2019.
Lin Zhu et al., "Conversion efficiency limits and bandgap designs for multi-junction solar cells with internal radiative efficiencies below unity", Optics Express, vol. 24, Mar. 22, 2016, A740-A751.
Bengt Aurivillius, "The Crystal Structures of Two Forms of BaBi2S4", Acta Chemica Scandinavica, Series A: Physical and Inorganic Chemistry (1983), A37(5), pp. 399-407.
Von Louis D. C. Bok and Johan H. de Wit, "Zur Kenntnis einiger ternarer Sulfide und Selenide", Zeitschrift fur Anorganische und Allgemeine Chemie (1963), 324(3-4), pp. 162-167 (with English Summary on the first page).

(Continued)

*Primary Examiner* — Magali P Slawski
(74) *Attorney, Agent, or Firm* — McDermott Will & Emery LLP

(57) ABSTRACT

The present disclosure provides a light energy conversion element in which a material having a bandgap suitable for a light energy conversion layer is used. The light energy conversion element according to the present disclosure comprises a light energy conversion layer containing $BaBi_2S_4$ having a hexagonal crystal structure.

2 Claims, 6 Drawing Sheets

Incidence Direction of Light

(56) References Cited

PUBLICATIONS

Linsey C. Seitz et al., "Modeling Practical Performance Limits of Photoelectrochemical Water Splitting Based on the Current State of Materials Research", ChemSusChem, vol. 7, Apr. 1, 2014, pp. 1372-1385.
Chen, Z. et al., "Schottky Solar Cells Based on CsSnI3 thin-films," Applied Physics Letters; 101, Aug. 2012; pp. 093901-1-.093901-4.

Incidence Direction of Light

LIGHT ENERGY CONVERSION ELEMENT AND DEVICE COMPRISING THE SAME

BACKGROUND

1. Technical Field

The present disclosure relates to a light energy conversion element and a device comprising the same.

2. Description of the Related Art

A semiconductor is irradiated with light having energy of not less than a bandgap of the semiconductor to generate a pair of an electron and a hole in the semiconductor. The semiconductor is used for (i) a solar cell or a photodetector in which the pair is separated to output electric energy and (ii) a hydrogen generation device in which water is split using the pair for chemical reaction of the water splitting to generate hydrogen.

Non-Patent Literature 1 discloses a bandgap of a semiconductor suitable for a solar cell. Furthermore, Non-Patent Literature 1 discloses a solar cell comprising one light energy conversion layer formed of a semiconductor. According to Non-Patent Literature 1, as one example, the light energy conversion layer has a bandgap of not less than 1.34 eV and not more than 1.53 eV.

Non-Patent Literature 2 discloses a bandgap of a semiconductor suitable for water splitting with sunlight energy (hereinafter, referred to as "solar water splitting").

CITATION LIST

Non-Patent Literature

Non-Patent Literature 1: Lin Z. et al., "Conversion efficiency limits and bandgap designs for multi-junction solar cells with internal radiative efficiencies below unity", Optics Express, Vol. 24, A740-A751 (2016)

Non-Patent Literature 2: Linsey C. Seitz et al., "Modeling Practical Performance Limits of Photoelectrochemical Water Splitting Based on the Current State of Materials Research", ChemSusChem, Vol. 7, 1372-1385 (2014)

Non-Patent Literature 3: Von Louis D. C. Bok, and Johan H. de Wit, Zeitschrift fuer Anorganische und Allgemeine Chemie (1963), 324(3-4), pp. 162-167

Non-Patent Literature 4: Bengt Aurivillius, Acta Chemica Scandinavica, Series A: Physical and Inorganic Chemistry (1983), A37(5), pp. 399-407

SUMMARY

An object of the present disclosure is to provide a light energy conversion element in which a material having a bandgap suitable for a light energy conversion layer is used.

The light energy conversion element according to the present disclosure comprises a light energy conversion layer containing $BaBi_2S_4$ having a hexagonal crystal structure.

The present disclosure provides a light energy conversion element in which a material having a bandgap suitable for a light energy conversion layer is used.

DETAILED DESCRIPTION OF THE EMBODIMENTS

Embodiment

Hereinafter, the embodiments of the present disclosure will be described with reference to the drawings.

First Embodiment

Figure 1:
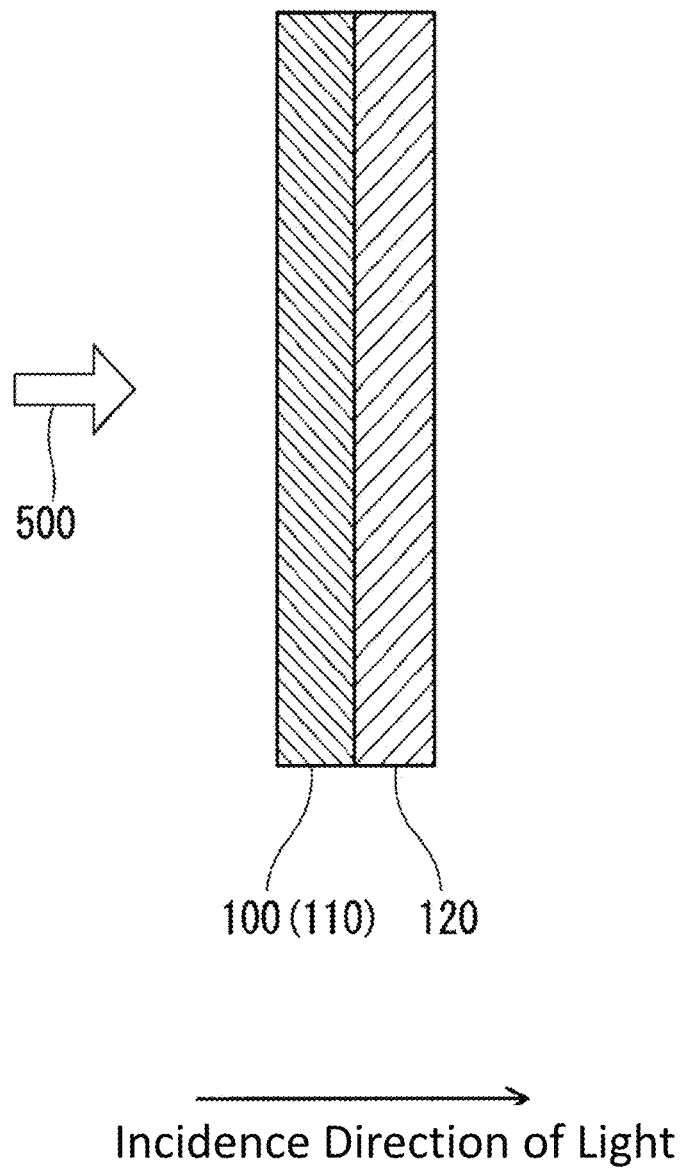
FIG. 1 shows a cross-sectional view of a light energy conversion element according to the first embodiment of the present disclosure.

FIG. 1 shows a cross-sectional view of a light energy conversion element 100 according to the first embodiment of the present disclosure. As shown in FIG. 1, light 500 traveling from a predetermined direction is incident on the light energy conversion element 100 (hereinafter, abbreviated to "element 100"). The element 100 comprises a light energy conversion layer 110. In FIG. 1, the element 100 is composed only of the light energy conversion layer 110. However, the element 100 may further comprise another element other than the light energy conversion layer 110. In FIG. 1, the referential sign 120 indicates a first electrode 120.

The light energy conversion material contained in the light energy conversion layer 110 is required to have a suitable bandgap. For example, the light energy conversion material has a bandgap of not less than 1.2 eV and not more than 1.6 eV.

The light energy conversion layer 110 contains $BaBi_2S_4$ as the light energy conversion material. $BaBi_2S_4$ has a hexagonal crystal structure. $BaBi_2S_4$ satisfies a bandgap suitable as the light energy conversion material. In other words, $BaBi_2S_4$ has a bandgap of not less than 1.2 eV and not more than 1.6 eV.

In FIG. 1, the first electrode 120 is located downstream of the light energy conversion layer 110 in the incident direction of the light. However, the location of the first electrode 120 is not limited to the position shown in FIG. 1. The first electrode 120 may be located upstream of the light energy conversion layer 110 in the incident direction of the light. The first electrode 120 may be an electrical conductor having transparency such that visible light travels through the first electrode 120. An example of the light is visible light. If the first electrode 120 is located upstream of the light energy conversion layer 110 in the incident direction of the light, the first electrode 120 is required to be an electric conductor having transparency such that light travels through the first electrode 120.

The number of the light energy conversion layer 110 included in the element 100 is one. However, the light energy conversion element of the present disclosure may be a multi-junction light energy conversion element comprising a plurality of light energy conversion layers. In the multi-junction light energy conversion element, the position of the light energy conversion layer containing $BaBi_2S_4$ as the light energy conversion material is not limited. The light energy conversion layer containing $BaBi_2S_4$ is disposed suitably in light of relation between bandgaps of $BaBi_2S_4$ and a light energy conversion material contained in another energy light conversion layer. If the multi-junction light energy conversion element comprises two light energy conversion layers, the light energy conversion layer containing $BaBi_2S_4$ may be located downstream (namely, at the bottom side) in the incident direction of the light. In other words, another energy light conversion layer may be located upstream of the light energy conversion layer containing $BaBi_2S_4$. The multi-junction light energy conversion element comprising two light energy conversion layers may be referred to as a tandem light energy conversion element.

If the light energy conversion element of the present disclosure is a multi-junction light energy conversion layer, the plurality of the light energy conversion layers may be in contact with each other; alternatively, do not have to be in contact with each other. For example, a joint layer may be provided between the two stacked light energy conversion layers.

Hereinafter, $BaBi_2S_4$ which is used as the light energy conversion material will be described.

Figure 2:
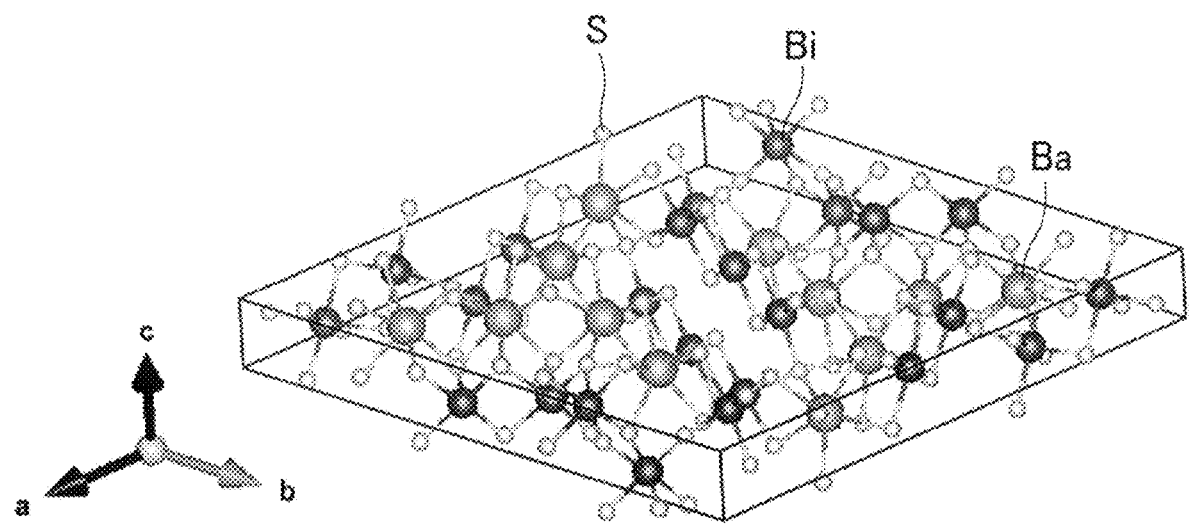
FIG. 2 shows a crystal structure of $BaBi_2S_4$.

FIG. 2 shows a hexagonal crystal structure of $BaBi_2S_4$. The crystal of $BaBi_2S_4$ has a trigonal system. Crystal structure optimization of $BaBi_2S_4$ was conducted on the basis of first principles calculation using the crystal structure shown in FIG. 2. The first principles calculation was conducted on the density functional theory by a projector augmented wave method (hereinafter, referred to as "PAW method"). In the crystal structure optimization, generalized gradient approximation Perdew-Burke-Emzerhof (hereinafter, referred to as "GGA-PBE") was used for the description of electron density which expresses exchange-correlation term which is interaction between electrons. A bandgap of $BaBi_2S_4$, an effective mass of an electron, an effective mass of a hole, and a light absorption coefficient spectrum were calculated on the basis of the first principles calculation, using the optimized crystal structure. Heyd-Scuseria-Ernzerhof 06 (hereinafter, referred to as "HSE 06") was used for the calculation of the bandgap of $BaBi_2S_4$, the effective mass of the electron, the effective mass of the hole, and a light absorption coefficient spectrum. It is known that physical properties of a semiconductor can be predicted accurately with the HSE 06.

Figure 3:
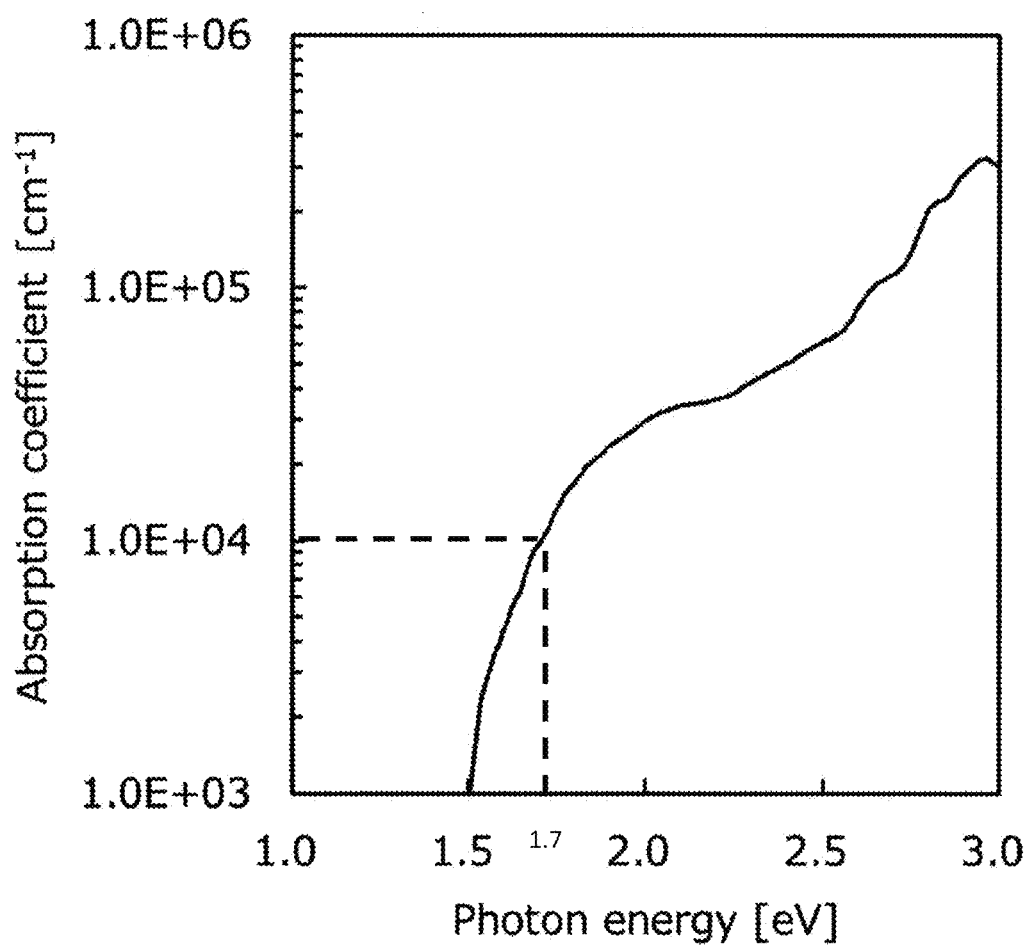
FIG. 3 shows a light absorption coefficient spectrum of $BaBi_2S_4$ provided on the basis of first principles calculation.

The effective mass of the electron was calculated from state density under a presumption that the bottom of the conduction band in energy distribution was parabolic. Likewise, the effective mass of the hole was calculated from state density under a presumption that the top of the valence band in energy distribution was parabolic. The light absorption coefficient spectrum was calculated from a dielectric function calculated on the basis of first principles calculation. Table 1 shows the bandgap of $BaBi_2S_4$, the effective mass of the electron, and the effective mass of the hole, all of which were calculated as above. Table 1 also shows a light absorption coefficient at the energy which is larger than the bandgap of $BaBiS_4$ by 0.2 eV. As well known in the technical field, in this description, the phrase "light absorption coefficient at the energy which is larger than the bandgap of $BaBiS_4$ by 0.2 eV" is calculated on the basis of a graph (See FIG. 3) of the light absorption coefficient spectrum calculated above. The horizontal axis and the vertical axis in the graph represent the energy and the light absorbance, respectively. If the energy is equal to the bandgap, the light absorbance is zero. "The light absorption coefficient at the energy which is larger than the bandgap of $BaBiS_4$ by 0.2 eV" is the light absorbance which corresponds to the energy which is larger than the bandgap of $BaBiS_4$ by 0.2 eV. As shown later in Table 1, since $BaBi_2S_4$ has a bandgap of 1.5 eV, "light absorption coefficient at the energy which is larger than the bandgap of $BaBiS_4$ by 0.2 eV" means the light absorption coefficient at 1.7 eV. With regard to the effective mass of the electron, in Table 1, a ratio of the effective mass of the electron ($me^*$) to the static mass of the electron (m0) is shown. In other words, the ratio ($me^*/m0$) is shown in Table 1 as the effective mass of the electron. With regard to the effective mass of the hole, in Table 1, a ratio of the effective mass of the hole ($mh^*$) to the static mass of the electron (m0) is shown. In other words, the ratio ($mh^*/m0$) is shown in Table 1 as the effective mass of the hole. FIG. 3 shows a light absorbance coefficient spectrum of $BaBi_2S_4$.

As is clear from Table 1 and FIG. 3, $BaBi_2S_4$ has a bandgap suitable as a material of the light energy conversion layer in the light energy conversion element such as a solar cell device or a solar water splitting device. Furthermore, electrons and holes excited by light are required to migrate to the electrodes without deactivation in the light energy conversion element. Likewise, without deactivation, electrons and holes excited by light are required to reach interfaces on which chemical reactions occur. For this reason, in the light energy conversion material, it is desirable that both the effective mass of the electron and the effective mass of the hole are small. For example, a ratio of the effective mass of the electron to the static mass of the electron is less than 1. Hereinafter, the ratio of the effective mass of the electron to the static mass of the electron is referred to as an effective mass ratio of the electron. Likewise, for example, a ratio of the effective mass of the hole to the static mass of the electron is less than 5. Hereinafter, the ratio of the effective mass of the hole to the static mass of the electron is referred to as an effective mass ratio of the hole. $BaBi_2S_4$ has an effective mass ratio of the electron of less than 1 and an effective mass ratio of the hole of less than 5. Therefore, $BaBi_2S_4$ has a significantly small effective mass as a semiconductor material. In addition, $BaBi_2S_4$ has a large light absorption coefficient of $1 \times 10^4$ cm$^{-1}$ at the energy which is larger than the bandgap of $BaBi_2S_4$ by 0.2 eV (i.e., at the energy of 1.7 eV). See FIG. 3. As is clear from FIG. 3, the light absorption coefficient at the energy (i.e., 1.7 eV) which is larger than the bandgap (i.e., 1.5 eV) of the $BaBi_2S_4$ by 0.2 eV is $1 \times 10^4$ cm$^{-1}$. As shown in FIG. 3, the light absorption coefficient at the energy equal to or larger than 1.7 eV is not less than $1 \times 10^4$ cm$^{-1}$. Therefore, $BaBi_2S_4$ has a large light absorption coefficient of not less than $1 \times 10^4$ cm$^{-1}$ within an energy range of not less than 1.7 eV.

Besides, as a result of the mixture of 6s orbital of Bi and 3p orbital S, a top of a valence band is composed of anti-boding orbital. If a defect is introduced in a material having such an electron structure, it is expected that deep level is not formed and that shallow level is formed in the material. The deep level serves as a recombination site of carriers to affect adversely on carrier transportation property. Hence, desirably, the material of the light energy conversion element has a property that the shallow level is formed even if the defect is present.

As above, $BaBi_2S_4$ is significantly potential as a material of a light energy conversion element. In other words, if $BaBi_2S_4$ is used as the light energy conversion layer of the light energy conversion element, sunlight having appropriate wavelengths is absorbed efficiently in the light energy conversion element. As a result, the multi-junction light energy conversion element exhibits an excellent carrier transportation property. In this way, the light energy conversion element achieves high energy conversion efficiency.

TABLE 1

| Chemical Formula | Bandgap [eV] | Effective Mass | | Light Absorption Coefficient at the energy which is larger than bandgap by 0.2 eV [cm$^{-1}$] |
| --- | --- | --- | --- | --- |
| | | me*/m0 | mh*/m0 | |
| BaBi$_2$S$_4$ | 1.5 | 0.84 | 4.7 | $1.0 \times 10^4$ |

Next, the fabrication method of BaBi$_2$S$_4$ will be described.

BaBi$_2$S$_4$ having a hexagonal crystal structure may be fabricated by a known method. For example, according to Non-Patent Literature 3, BaS, Bi, and S are mixed, and then, the mixture is sintered at 600 degrees Celsius to provide BaBi$_2$S$_4$ having a hexagonal crystal structure. According to Non-Patent Literature 4, BaS and Bi$_2$S$_3$ are mixed, and then, the mixture is sintered at 640 degrees Celsius under a vacuum to provide BaBi$_2$S$_4$ having a hexagonal crystal structure.

Second Embodiment

Figure 4:
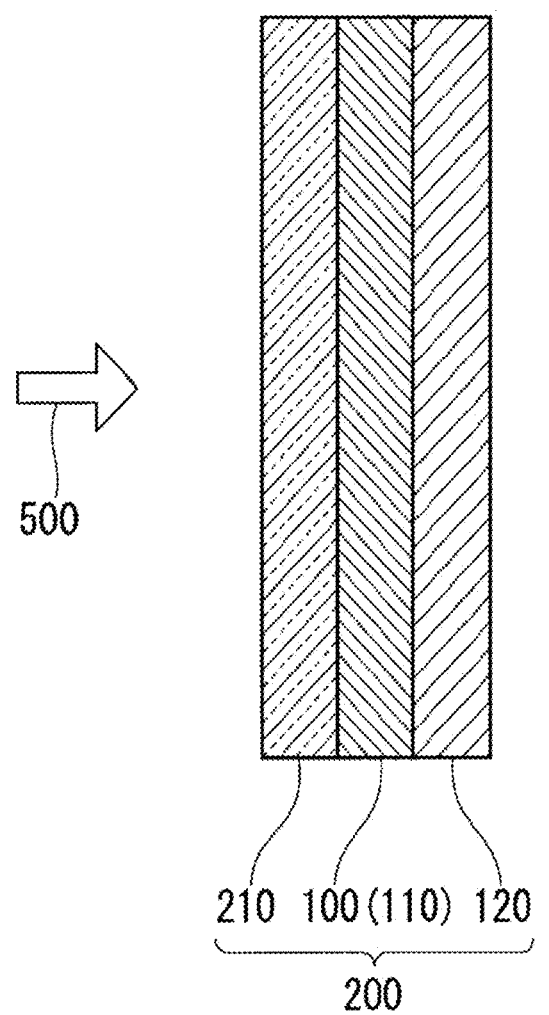
FIG. 4 shows a cross-sectional view of a device according to the second embodiment of the present disclosure.

FIG. 4 shows a cross-sectional view of a device according to the second embodiment of the present disclosure. The device 200 shown in FIG. 4 comprises the element 100 set forth in the first embodiment. The device 200 further comprises the first electrode 120 and a second electrode 210. In the device 200 shown in FIG. 4, the first electrode 120 is located downstream of the light energy conversion layer 110 in the incident direction of the light toward the element 100. However, as set forth in the first embodiment, the first electrode 120 is located upstream of the light energy conversion layer 110. In the second embodiment, the light energy conversion layer 110 is provided between the first electrode 120 and the second electrode 210. If the element 100 is a multi-junction light energy conversion element, the plurality of the light energy conversion layers included in the light energy conversion element are provided between the first electrode 120 and the second electrode 210.

In the device 200, the element 100 is irradiated with light to convert the light into electric energy. In the device 200 shown in FIG. 4, the second electrode 210 is located upstream of the light energy conversion layer 110 in the incident direction of the light. In this case, the second electrode 210 is an electrical conductor having transparency such that the light travels through the second electrode 210. If the first electrode 120 is located upstream of the light energy conversion layer 110 in the incident direction of the light, the second electrode 210 is located downstream of the light energy conversion layer 110. In this case, the first electrode 120 is required to have transparency such that the light travels through the first electrode 120; however, the second electrode 210 does not have to have such transparency.

When the device 200 is irradiated with light, the light travels through the second electrode 210. Then, a part of the light which corresponds to the bandgap of BaBi$_2$S$_4$ is absorbed by BaBi$_2$S$_4$, which serves as the light energy conversion material in the light energy conversion layer 110. The other part of the light which does not correspond to the bandgap of the BaBi$_2$S$_4$ is not absorbed. The energy of the light absorbed in the light energy conversion layer 110 is converted into electric energy and output as an electric power through the first electrode 120 and the second electrode 210.

Third Embodiment

Figure 5:
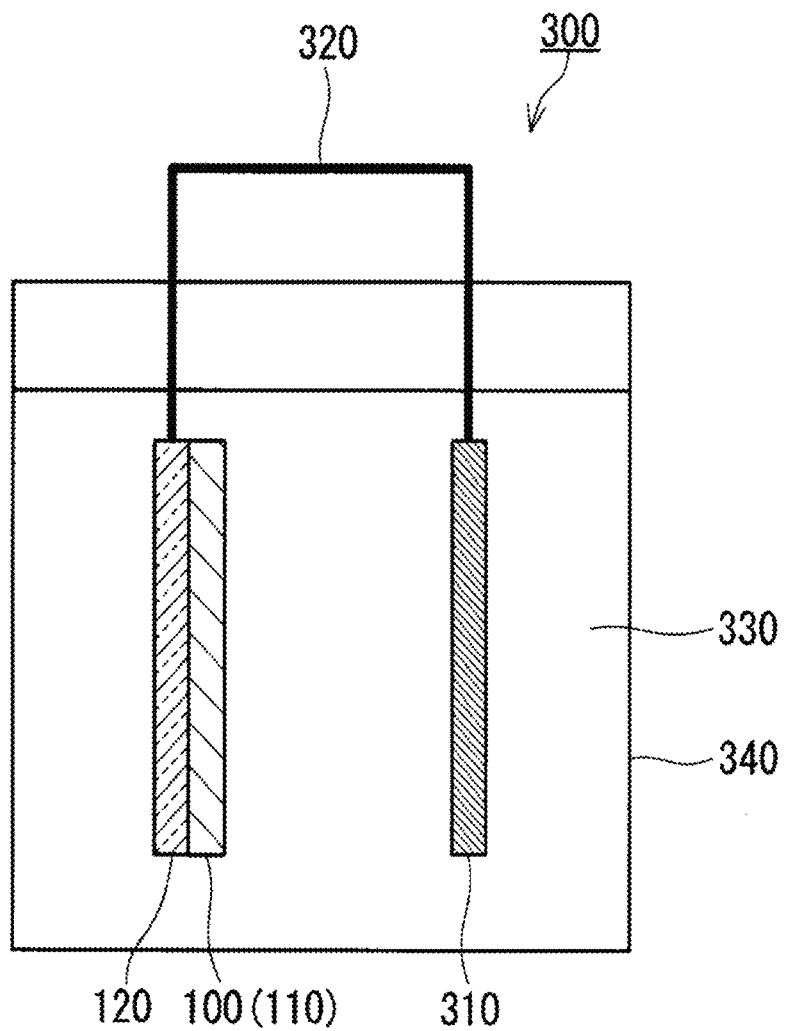
FIG. 5 shows a cross-sectional view of a device according to the third embodiment of the present disclosure.

FIG. 5 shows a cross-sectional view of a device according to the third embodiment of the present disclosure. The device 300 shown in FIG. 5 comprises the light energy conversion element 100 according to the first embodiment. The device 300 further comprises the first electrode 120, an electrode 310, a liquid 330, and a container 340. In the device 300, the element 100 is irradiated with light to split water. The first electrode 120 has been described in the first embodiment.

The electrode 310 is electrically connected to the first electrode 120 of the element 100 through an electric wire 320.

The liquid 330 is water or an electrolyte solution. The electrolyte solution is acidic or alkaline. An example of the electrolyte solution is a sulfuric acid aqueous solution, a sulfuric sodium aqueous solution, a sodium carbonate aqueous solution, a phosphate buffer solution, or a boric acid buffer solution.

The container 340 contains the element 100, the electrode 310, and the liquid 330. The container 340 may be transparent. In particular, at least a part of the container 340 may be transparent in such a manner that light travels from the outside of the container 340 to the inside of the container 340.

When the element 100 is irradiated with light, oxygen or hydrogen is generated on the surface of the element 100 and hydrogen or oxygen is generated on the surface of the electrode 310. Light such as sunlight travels through the container 340 to reach the element 100. Electrons and holes are generated in the conduction band and the valence band of the light energy conversion material contained in the light energy conversion layer 110 in which the light has been absorbed, respectively. These generated electrons and holes cause water splitting reaction. In a case where BaBi$_2$S$_4$ contained as the light energy conversion material of the element 100 serves an n-type semiconductor, water is split on the surface of the element 100 as shown in the following reaction formula (I) to generate oxygen. In the case, hydrogen is generated on the surface of the electrode 310 as shown in the following reaction formula (II). In a case where BaBi$_2$S$_4$ contained as the light energy conversion material of the element 100 serves as a p-type semiconductor, water is split on the surface of the electrode 310 as shown in the following reaction formula (I) to generate oxygen. In the case, hydrogen is generated on the surface of the element 100 as shown in the following reaction formula (II).

$$4h^+ + 2H_2O \rightarrow O_2\uparrow + 4H^+ \qquad (I)$$

($h^+$ represents a hole)

$$4e^- + 4H^+ \rightarrow 2H_2\uparrow \qquad (II)$$

In the device 300 shown in FIG. 5, the light may travel through the first electrode 120, and then, the light which has traveled through the first electrode 120 reaches the element 110. Alternately, the light may travel through the electrode 310, and then, the light which has traveled through the electrode 310 reaches the element 100. Note that the electrode 310 has transparency such that light (e.g., visible light) travels through the electrode 310, if the light which has traveled through the electrode 310 reaches the element 100.

Figure 6:
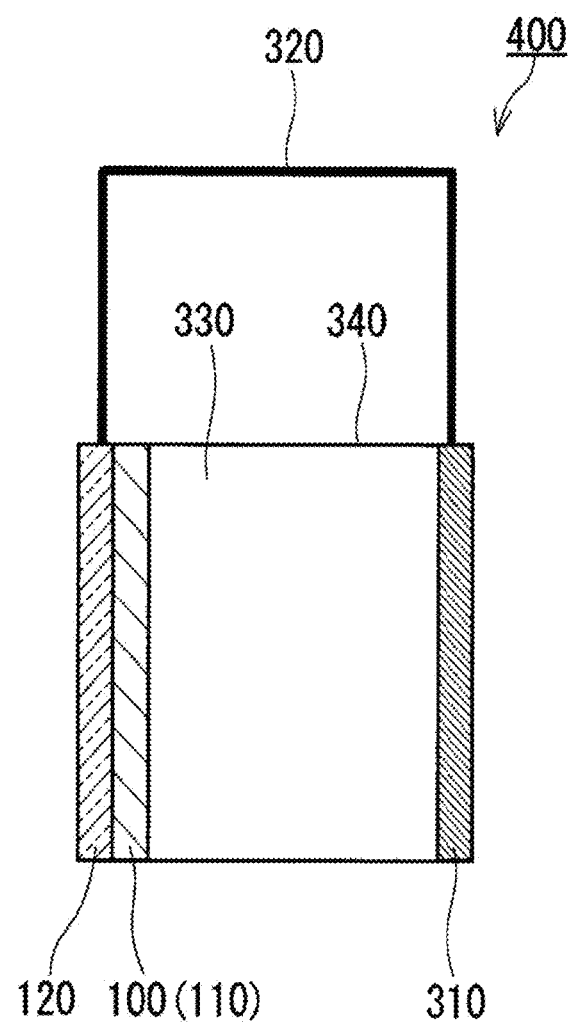
FIG. 6 shows a cross-sectional view of a variation of the device according to the third embodiment of the present disclosure.

The device according to the third embodiment is not limited to the device shown in FIG. 5. For example, like the device 400 shown in FIG. 6, the device according to the third embodiment may be a device in which the electrode 310 and the container 340 are integrated in such a manner that the back surfaces and the side surfaces of the electrode 120 and the electrode 310 are in contact with the inner wall of the container 340. In this way, downsizing of the device can be achieved. Furthermore, the device 400 has high liquid resistance of the electrode 120 and the electrode 310, high light utilization efficiency, and high pressure resistance. In more detail, in the device 400, since the back surfaces and the side surfaces of the electrode 120 and the electrode 310 are not in contact with the liquid 330, the materials of the electrode 120 and the electrode 310 are not required to have high resistance against the liquid 330. Therefore, a selection range of the materials used for the electrode 120 and the electrode 310 is expanded. In addition, the liquid 330 absorbs light having a long wavelength such as infrared light. In the device 400, in the path of the light which travels through the container 340 and then reaches the light energy conversion element 100, the distance of the light which travels through the liquid 330 is short. Therefore, in the device 400, the intensity of light absorbed by the liquid 330 is suppressed. As a result, the utilization efficiency of the light is improved. In addition, in the device 400, since the amount of the liquid 330 is decreased, severity of pressure resistance design of the device 400 in light of water pressure is mitigated. In the device 400 shown in FIG. 6, the back surfaces and the side surfaces of the electrode 120 and the electrode 310 are in contact with the inner wall of the container 340. However, either the electrode 120 or the electrode 310 may be in contact with the inner wall of the container 340. Alternatively, only a part of the back surface and the side surface may be in contact with the container 340.

INDUSTRIAL APPLICABILITY

In the light energy conversion element according to the present disclosure, a material having a bandgap suitable for a light energy conversion layer is used. Hence, the light energy conversion element according to the present disclosure can be used suitably for a device such as a solar cell or solar water splitting.

REFERENTIAL SIGNS LIST

100: Light energy conversion element
110: Light energy conversion layer
120: First electrode
200: Device
210: Second electrode
300: Device
310: Electrode
320: Electric wire
330: Liquid
340: Container
400: Device
500: Light

The invention claimed is:

1. A photovoltaic device, comprising:
a photovoltaic active layer containing $BaBi_2S_4$ having a hexagonal crystal structure;
a first electrode connected electrically to the photovoltaic active layer; and
a second electrode connected electrically to the photovoltaic active layer,
wherein the photovoltaic active layer is provided between the first electrode and the second electrode.

2. A method for converting light into electric energy, the method comprising:
irradiating a photovoltaic active layer containing $BaBi_2S_4$ having a hexagonal crystal structure with light to take out the electric energy from a first electrode and a second electrode, both of which are electrically connected to the photovoltaic active layer.

* * * * *